United States Patent [19]

Sato

[11] Patent Number: 4,800,591
[45] Date of Patent: Jan. 24, 1989

[54] SIGNAL PROCESSING APPARATUS

[75] Inventor: Yuichi Sato, Yokohama, Japan

[73] Assignee: Canon Kabushiki Kaisha, Tokyo, Japan

[21] Appl. No.: 4,270

[22] Filed: Jan. 6, 1987

Related U.S. Application Data

[63] Continuation of Ser. No. 416,364, Sep. 9, 1982, abandoned.

[30] Foreign Application Priority Data

Sep. 17, 1981 [JP] Japan .................... 56-146583
Sep. 21, 1981 [JP] Japan .................... 56-149278
Sep. 21, 1981 [JP] Japan .................... 56-149279

[51] Int. Cl.$^4$ .................... G06K 9/00; H03M 1/42
[52] U.S. Cl. .................... 382/50; 341/158
[58] Field of Search ............ 340/347 AD; 382/50–53

[56] References Cited

U.S. PATENT DOCUMENTS 4,270,118  5/1981  Brokaw .................. 340/347 AD
4,326,192  4/1982  Merrill et al. .......... 340/347 AD
4,375,059  2/1983  Schlig .................. 340/347 AD Primary Examiner—Leo H. Boudreau
Attorney, Agent, or Firm—Fitzpatrick, Cella, Harper & Scinto

[57] ABSTRACT

An improved signal processing apparatus for adjusting the γ-characteristic of video signals, in which the γ-correction is conducted either in a process of converting analog video signals into digital signals, or in a signal processing at charge level on the image charge signal formed in the image pickup element.

9 Claims, 14 Drawing Sheets

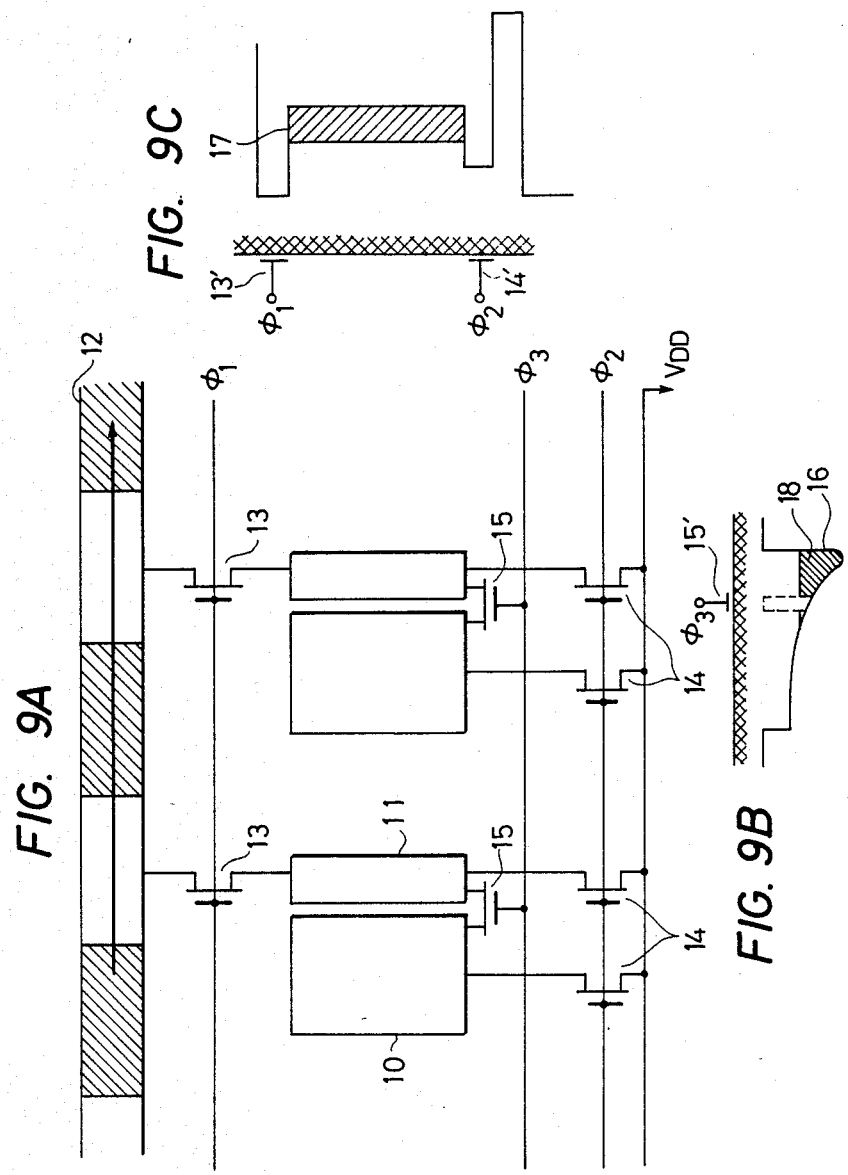

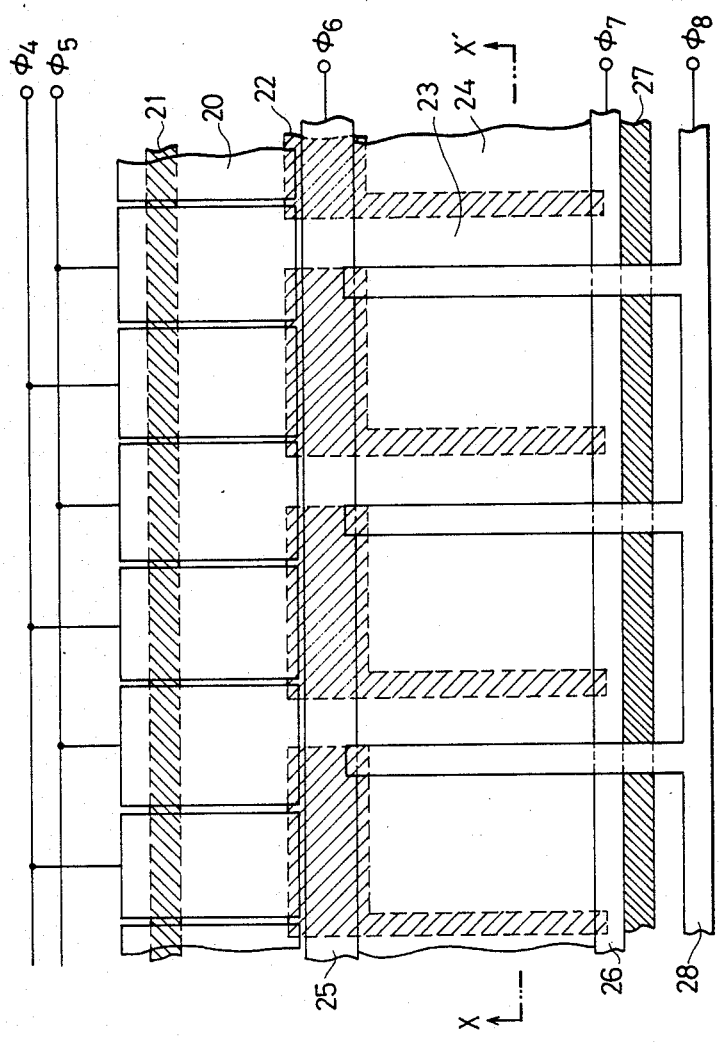
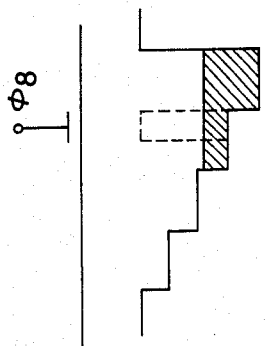
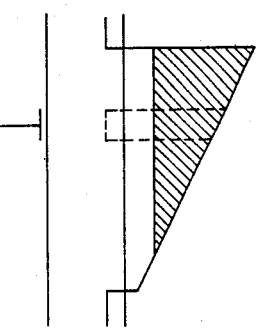

SIGNAL PROCESSING APPARATUS

This application is a continuation of application Ser. No. 416,364 filed Sept. 9, 1982, now abandoned.

BACKGROUND OF THE INVENTION

1. Field of the Invention

The present invention relates to a signal processing apparatus for processing video signals for the purpose of γ-correction or the like.

2. Description of the Prior Art

Reproduction of a color television image is conducted by controlling electron beams from three electron guns of a color cathode ray tube, thus causing light emissions from red, green and blue phosphors. If the grid signal voltage supplied to the grid of the image tube and the amount of light emission are in a linear relation so that the latter is in proportion to the former, the signal voltages directly correspond to the stimulus values of red, green and blue light. In fact, however, the amount of light emission lacks such linearity, and is proportional to about 2.2 powers of the signal voltage.

For this reason, the signal voltages obtained in a television camera in proportion to the stimulus values of an object will, if supplied directly to the cathode ray tube of such non-linear characteristic, reproduce a color image distorted not only in luminance but in hue and saturation. In a color television system, therefore, it is necessary to supply the signal to the cathode ray tube through a non-linear circuit with an output-to-input characteristic equal to the power of 1/2.2, whereby the overall characteristic of the system including that of the cathode ray tube becomes linear.

The relation between the light emission L and the grid signal voltage E in a color cathode ray tube can be approximated by the following equation:

$$L = kE^\gamma$$

wherein k is a constant. γ is the slope of L plotted against E with both in logarithmic scale, which is called the γ-characteristic of the cathode ray tube. γ is usually 2.2 for a color cathode ray tube. Such correction for the γ-characteristic is best conducted in the television receiver, but is generally effected on the output signal of the television camera in order not to complicate the circuits of the television receiver. The circuit for the above-mentioned non-linear correction is called the γ-correction circuit.

However, the conventional γ-correction circuit is not only complicated in structure but also is a bar to designing a compact and sample image pickup unit since such correction circuits are needed both for the luminance signal and for the color circuit is needed for each of the luminance signal and color difference signal.

Particularly in the case of obtaining video signals from a semi-conductor image pickup device, such γ-correction will intolerably reduce the dynamic range of the signals since the charges generated in such image pickup device only have a limited dynamic range.

Also in combination with the digitization of video signals recently developed, the γ-correction, if applied after analog-to-digital conversion, will require not only a complicated correction circuit but also a complicated synchronization control.

SUMMARY OF THE INVENTION

An object of the present invention is to provide a signal processing apparatus capable of easy signal processing such as γ-correction.

Another object of the present invention is to provide an image pickup apparatus with a wide dynamic range.

Still another object of the present invention is to provide an image pickup apparatus provided with a simplified circuit structure for signal processing such as γ-correction.

Still another object of the present invention is to provide a signal processing apparatus capable of signal processing such as γ-correction in the process of analog-to-digital conversion of video signals.

Still another object of the present invention is to provide a signal processing apparatus capable of high-speed analog-to-digital conversion of video signals.

Still another object of the present invention is to provide an analog-to-digital converter adapted for on-chip preparation in combination with a semi-conductor image pickup device.

Still another object of the present invention is to provide a signal processing apparatus adapted for direct analog-to-digital conversion of charge signals.

Still another object of the present invention is to provide a signal processing apparatus in which the term required for analog-to-digital conversion remains substantially constant even when the number of digital bits is increased at the analog-to-digital conversion.

In order to achieve the above-mentioned objects, there are provided, according to one aspect of the present invention, comparator means having different reference levels for different addresses of an analog shift register, and plural registers to be refreshed in response to the output signals of said comparator means.

In another aspect of the invention, the potential wells corresponding to different addresses of the analog shift register have different capacities.

In another aspect, the information of one picture element is provided by plural areas having different charge accumulating characteristics.

In another aspect, only charges at a part of a picture element is taken out as the output signal.

Still other objects and advantages of the present invention will become fully apparent from the following description to be taken in conjunction with the attached drawings.

BRIEF DESCRIPTION OF THE DRAWINGS

FIGS. 9A to 9C are schematic views showing a fifth embodiment of the present invention;

FIG. 10A is a view showing an example of the electrode pattern for use in the apparatus shown in FIG. 9A, and FIGS. 10B and 10C show its potential;

DESCRIPTION OF THE PREFERRED EMBODIMENTS

Now the present invention will be described in detail with reference to embodiments thereof shown in the attached drawings.

Figure 1:
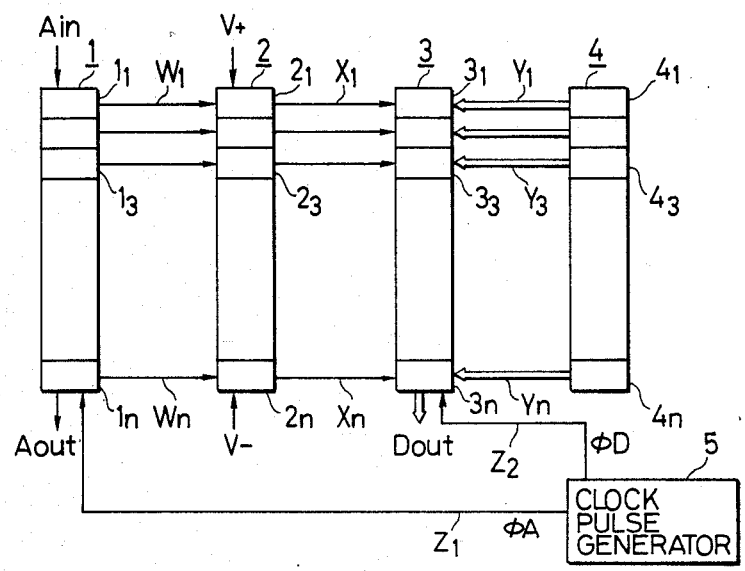
FIG. 1 is a block diagram showing a first embodiment of the signal processing apparatus of the present invention.

FIG. 1 is a block diagram showing the entire structure of a first embodiment, wherein different addresses $1_1-1_n$ of an analog shift register 1 are respectively connected to the addresses $2_1-2_n$ of a comparator 2 constituting discriminating means, through lines $W_1-W_n$. Said comparator 2 generates reference voltages, for respective stages, from the voltages V+ and V−, and produces binary discrimination signals by comparing said reference voltages with the content of the analog shift register 1. Said binary signals are supplied as selection signals to the stages $3_1-3_n$ of a digital shift register 3 constituting shift means, through lines $X_1-X_n$. The stages $3_1-3_n$ of said digital shift register 3 respectively receive predetermined binary codes from the stages $4_1-4_n$ of a binary code generator 4 through lines $Y_1-Y_n$. Consequently each of the stages $3_1-3_n$ of said digital shift register 3 stores either the content of the preceding digital shift register or the binary code from the binary code generator 4, according to whether said selection signal is "1" or "0". Said binary code generator 4 may be composed of memories such as ROM, PROM, EPROM, RAM, etc.

Also the stages $4_1-4_n$ of said binary code generator 4 may be so composed as to generate binary codes corresponding to decimal numbers 1 to n. Otherwise they may be so composed as to generate binary codes corresponding to the levels of the reference voltages in the comparator stages $2_1-2_n$. Furthermore they may so composed as to generate binary codes corresponding to logarithmic functions for γ-correction for the reference voltage levels of the comparator stages $2_1-2_n$.

A clock pulse generator 5 supplies shift pulses $\phi A$ through a line $Z_1$ to the analog shift register 1 and shift pulses $\phi D$ through a line $Z_2$ to the digital shift register 3. Ain and Aout respectively represent the input and output signals of the analog shift register 1, and Dout represents the output signal from the digital shift register 1.

Figure 2:
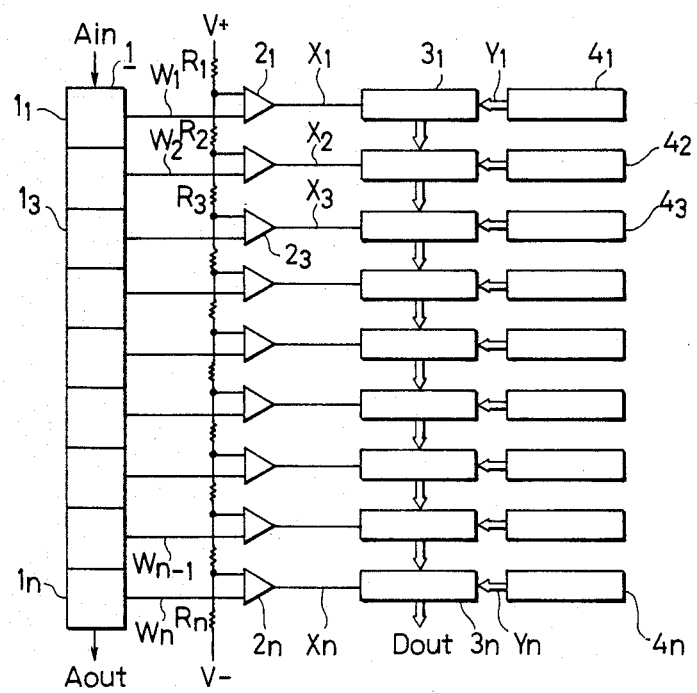
FIG. 2 is a block diagram showing the structure of a comparator.

FIG. 2 shows an embodiment of the comparator 2 shown in FIG. 1, constituting analog-to-digital (A/D) converters of 9 stages. Reference voltages for the comparator stages $2_1-2_n$ are produced by dividing the voltages V+, V− with resistors $R_1-R_n$. Said resistors $R_1-R_n$ may be of the same resistance or may have non-linearly changing resistances.

Figure 3:
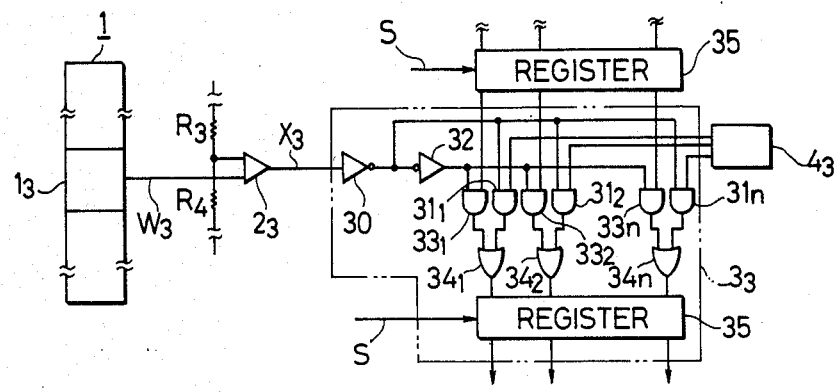
FIG. 3 is a circuit diagram showing an example of a digital shift register.

FIG. 3 shows an embodiment of a stage, for example the third stage, of the aforementioned digital shift register 3. Other stages may be of the same structure. Said stage is composed of an inverter 30 receiving the selection signal from the comparator stage $2_3$; AND gates $31_1-31_n$ of which first input terminals are connected to the output terminal of said inverter 30 and the other input terminals are connected to the output terminals of said binary code generator $4_3$; an inverter 32 serially connected to said inverter 30; AND gates $33_1-33_n$ of which first input terminals are connected to the output terminal of said inverter 32 and the other input terminals are connected to the output terminals of the preceding digital shift register; OR gates $34_1-34_n$ of which input terminals are respectively connected to the output terminals of corresponding AND gates $31_1-31_n$ and AND gates $31_1-33_n$; and a register 35 receiving in parallel the output signals of said OR gates.

In the above-described embodiment, the signal Ain entered into the analog shift register 1 is transferred therein, in response to the shift pulses $\phi A$, and the output signals from the stages $1_1-1_n$ of the analog shift register 1 are successively compared with the reference voltages in the comparator stages $2_1-2_n$. In the structure shown in FIG. 2, the threshold values of said comparison become lower in the lower comparator stages, since said reference voltages are generated, as explained before, by dividing the voltage V+, V− with the resistors $R_1-R_n$.

Consequently each of the above-mentioned input signal Ain is initially lower than the threshold level but exceeds the threshold level in a certain stage during the course of transfer in the analog shift register.

Thus, in case the input signal Ain is lower than the threshold level, the comparator 2 provides a low (L) level output signal to generate a high (H) level output signal from the inverter 30, whereby the AND gates $31_1-31_n$ are opened to enter the binary codes from the binary code generator 4 into the register 35 through the OR gates $34_1-34_n$. On the other hand, in case the input signal Ain becomes higher than the threshold level for example at the third stage, the inverter 30 generates an L-level signal to release an H-level signal from the inverter 32, whereby the AND gates $33_1-33_n$ are opened to enter the output signals of the preceding register into the register 35 through the OR gates $34_1-34_n$.

Thus, in case a signal in an address $1_m$ of the analog shift register 1 is smaller than the threshold level of the comparator stage $2_m$, the corresponding register $3_m$ stores a code, for example $C_m$, corresponding to said threshold level or to said address.

Then, if said signal exceeds the threshold level of the comparator stage $2_{m+1}$ upon shifting to the next address $1_{m+1}$, the register $3_{m+1}$ stores the code $C_m$.

In this manner, in response to the successive shifting of a signal in the analog shift register 1, a digital code representing an address where said signal exceeds the threshold level or an immediately preceding address is entered into the register 3. As the threshold level is simply decreased thereafter, said code in the register 3 is maintained therein, then successively shifted in the registers 3 in response to the signal shifting in the register 1, and finally released from the register 3 simultaneously with the signal readout from the register 1.

As explained in the foregoing, the above-described embodiment is capable not only of successively converting analog signals into digital signals, but also of signal processing such as γ-correction simultaneously with said analog-to-digital conversion by selecting a non-linear relationship between the threshold levels of the stages of the comparator 2 and the values of the codes generated by the code generator 4.

Also the A/D converter of the foregoing embodiment is capable of high-speed A/D conversion for continuous analog input signals with a high precision. Also the γ-characteristic may be incorporated in the code conversion or in the binary codes themselves since said binary codes may be selected arbitrarily. Said A/D converter is provided with the additional advantages that it can be easily prepared as a large-scale integrated circuit since different stages have the same structure, that the number of stages is relatively limited, and that the average processing time remains substantially constant even when the number of stages is increased.

Though the comparator 2 in the foregoing embodiment has monotonously decreasing reference voltage levels, it is also possible to adopt monotonously increasing reference voltage levels.

Figure 4:
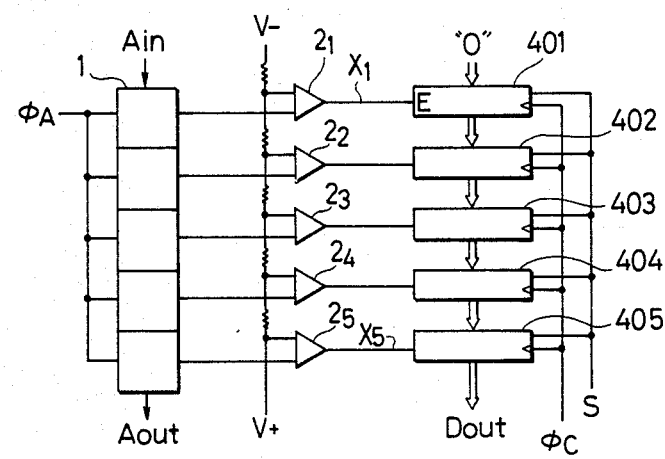
FIG. 4 is a block diagram showing a second embodiment of the present invention.

FIG. 4 shows a second embodiment of the signal processing apparatus of the present invention, wherein the circuit structure is simplified by the use of counters in place of the combination of the register 3 and the code generator 4. In FIG. 4, the same components as those in FIG. 1 are represented by the same numbers, and the reference voltage levels are selected in the monotonously increasing manner. Presettable counters 401–405 may be composed of general-purpose counters, for example SN74160 supplied by Texas Instruments Incorporated, and perform counting operation at the H-level state of enable terminals E but not in the L-level state thereof. $\phi_c$ represents the clock pulses for the counting operation, and S represents a load signal for signal loading. Each of comparators $2_1$–$2_5$ releases an H-level signal or an L-level signal respectively when the input signal is higher or lower than a reference level.

Figure 5:
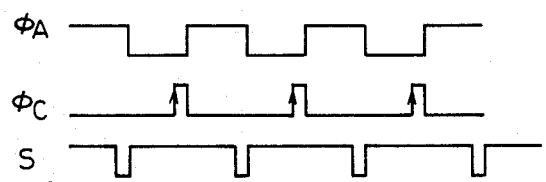
FIG. 5 is a timing chart showing the function of the apparatus shown in FIG. 4.

FIG. 5 is a timing chart showing the function of the circuit shown in FIG. 4, wherein the signal transfer is effected during the H-level state of the shift pulse $\phi A$.

Consequently, the counter 401 stores "0" in synchronization with the entry of a signal into the analog shift register 1, and the count-up operation by the clock pulse $\phi_c$ is effected in case said signal is higher than the reference level of the comparator $2_1$.

Subsequently said count is set in the counter 402 in response to the shift of said signal to the second address.

In case said signal is lower than the reference level of the comparator $2_2$, the counter 402 does not respond to the count-up clock pulse $\phi_c$ but retains the count number set as explained above.

In this manner the count number is transferred in the counters 401–405 with stepwise increases until the signal becomes lower at a certain address of the shift register 1 than the reference level of a corresponding comparator. Consequently, simultaneously with the signal readout from the register 1, the counter 405 releases a digital signal corresponding to said readout signal.

Figure 6:
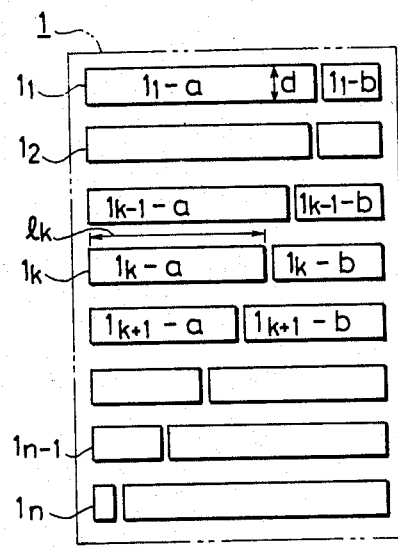
FIG. 6 is a block diagram showing the structure of the analog shift register in a third embodiment of the present invention.

FIG. 6 shows a third embodiment of the present invention which is capable of signal processing such as γ-correction at the conversion of analog video signals into digital signals as explained in the foregoing first embodiment but which features the property that the addresses of the analog shift register are provided with potential wells of different capacities for achieving the function of comparators in said register in contrast to said first embodiment wherein the non-linear conversion is achieved by the reference voltages of the comparator and the codes from the code generator.

FIG. 6 shows the form of electrodes of the analog shift register, in which each stage is composed of an electrode a for storing the transferred signal charge and an electrode b for storing the charge overflowing from said electrode a. Now let us consider the transfer of signal charge from an electrode $1_{k-1}$—a to an electrode $1_k$—a. If all the electrodes have the same width d, the dimension of the electrode $1_k$—a is proportional to the length $l_k$ of said electrode, thus producing a correspondingly proportional potential well, which represents the maximum charge to be stored in said electrode. In the embodiments shown in FIG. 6, said potential well becomes smaller at the lower stages. Consequently the signal charge can be entirely transferred initially but causes overflowing at a certain stage. Said overflowing charge may be discarded, but in the illustrated embodiment said overflowing charge is transferred to the succeeding stage through the electrode $1_k$—b.

Figure 7:
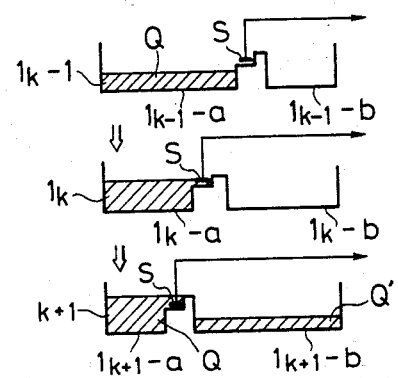
FIG. 7 is a chart showing potentials in various parts of the register shown in FIG. 6.

FIG. 7 shows the potential states in the (k−1)-th, k-th and (k+1)-th stages of the analog shift register 1, wherein a signal charge Q does not overflow from the potential well up to the k-th stage but causes overflowing at the (k+1)-th stage from the electrode $1_{k+1}$—a, thus generating an overflown charge Q' in the electrode $1_{k+1}$—b. In the present embodiment the amount of signal charge Q is measured by the dimension of the potential well. Consequently the reference values for measuring the signal charge are determined by the length $l_k$ of the electrodes, and a linear A/D conversion can be realized with linearly varying reference values if said length $l_k$ is determined according to an equation:

$$l_k = l_0 - ak \qquad (1)$$

wherein $l_0$ and a are constants, whereas a non-linear A/D conversion is achieved if said length $l_k$ is defined by an equation:

$$l_k = f(k) \qquad (2)$$

wherein f(k) is an arbitrary non-linear function. Said function f(k) has to be a monotonously decreasing function in case the electrodes $1_k$—b are not present or the charges overflowing from the electrodes $1_k$—a are discarded, but said function f(k) may also be an increasing function in a structure wherein the charge in the electrode $1_k$—a and the overflowing charge in the electrode $1_k$—b are collectively transferred to the succeeding electrode $1_{k+1}$—a. In the embodiment shown in FIG. 7, there is provided a detecting member S for detecting that the potential well is filled with the charge.

Figure 8:
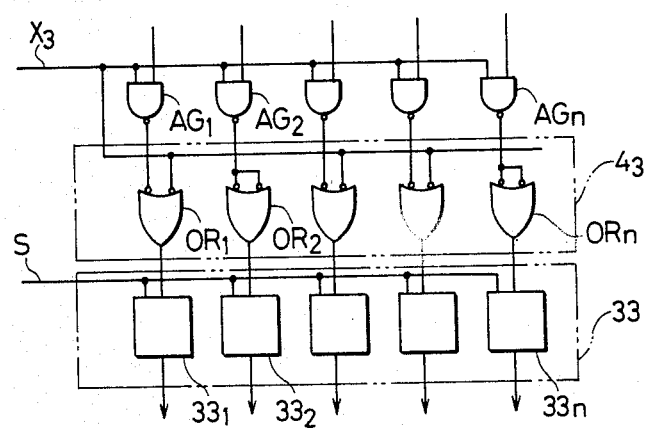
FIG. 8 is a block diagram showing a code generator in a fourth embodiment of the present invention.

FIG. 8 shows a fourth embodiment of the present invention, representing a variation of the digital shift register 3n and code generator 4n shown in FIG. 1, wherein n is for example equal to 3.

In the embodiment shown in FIG. 8, the code generator 4n is composed of a simple combination of OR gates. As shown in FIG. 8, NAND gates $AG_1$-$AG_n$ are connected through first input terminals thereof to the output terminal of the comparator $2_3$, and through the other terminals to the preceding digital register $3_2$. The output terminals of said NAND gates $AG_1$-$AG_2$ are respectively connected to first input terminals of OR with inverted inputs, gates $OR_1$-$OR_n$ of which the other inoput terminals are connected for the supply of binary codes to the output terminal of said comparator $2_3$ or to a selected one of said NAND gates $AG_1$-$AG_n$. The output terminals of said OR gates $OR_1$-$OR_n$ are respectively connected to the different digits $33_1$-$33_n$ of a digital register 33.

In the above-described embodiment, each address of the analog shift register 1 is capable of identifying whether the signal is higher or lower than a reference level specific to said address, and supplies a signal "1" or "0" to the digital shift register 3 respectively when the signal is higher or lower than said reference level.

Thus, in case a signal "1" is supplied through a line $X_3$, the NAND gates $AG_1$-$AG_n$ are opened to enter the content of the preceding digital register $3_2$ into the digital registers $33_1$-$33_n$ through inverted-input OR gates $OR_1$-$OR_n$. Also in response to a signal "0" supplied through the line $X_3$, the NAND gates $AG_1$-$AG_n$ are closed whereby a binary code set by the OR gates $OR_1$-$OR_n$, "10110" in the illustrated example, is stored in the digital registers $33_1$-$33_n$. Said binary code may be selected in an arbitrary manner.

FIGS. 9A to 9C show a fifth embodiment for conducting signal processing such as γ-correction, wherein each picture element of a charge-transfer device, such as a charge-coupled device (CCD), is provided with a non-linear characteristic for said γ-correction. It will also be understood that in the present embodiment the signal processing apparatus has an image pickup function. In FIG. 9A, first and second photoelectric converting areas 10, 11 combinedly correspond to one picture element known in the technology. There are also provided an analog shift register 12, and first gates 13 for transferring the signal charges in said second photoelectric converting areas to said analog shift register 12 in response to clock pulses $\phi 1$. Second gates 14 perform charge resetting by draining unnecessary charges in response to clock pulses $\phi 2$, and third gates 15 featuring the present invention mutually connect said first and second photoelectric converting areas in response to clock pulses $\phi 3$. FIGS. 9B and 9C illustrate the potential state in the above-described embodiment, wherein a curve 16 represents the approximate potential distribution in the lateral cross section of a photoelectric converting area, while a curve 17 shows the charge distribution in the vertical cross section of said area. In these cross sections said first, second and third gates are respectively represented by 13', 14' and 15'. During an exposure of the first and second photoelectric converting areas, with said first and second gates closed, a photoelectrically converted charge q (represented in FIG. 9B by the area 18) is accumulated in the potential wells of said areas. After said exposure, the third gate 15 is closed to divide said charge q into the first photoelectric converting area 10 and the second area 11. The divided charges $q_1$ and $q_2$ satisfy the following equation:

$$q = q_1 + q_2 \quad (1)$$

Subsequently the first gate 13 is opened to transfer the charge $q_2$ in the second photoelectric converting area to the analog shift register 12, and the first gate 13 is closed thereafter. The charges supplied to the analog shift register are transferred along the analog shift register in the direction of the arrow and released through an output amplifier. On the other hand the charges remaining in the first photoelectric converting areas are discarded to the drain by opening the second gates. Said second gates are maintained open until the exposure or charge accumulation is started, thus continuously draining said remaining charges. It is to be noted further that the second gate has a lower barrier than that of the first gate in the closed state as shown in FIG. 9C, whereby the excessive charges accumulated in the first and second converting areas during the exposure or charge accumulation step are drained through the second gates in the closed state, thereby preventing the so-called blooming phenomenon. According to the present embodiment the potential wells of the photoelectric converting areas were shaped as shown in FIGS. 9B and 9C, so that non-linear charge readout was assured by controlling the gates in the aforementioned manner. When the amount of charge q is small, all the charge is stored in the second converting area, satisfying a relation:

$$q_2 = q \quad \text{(for small q)} \quad (2)$$

On the other hand, when the amount of charge q is large, there holds the relation:

$$q_2 < q \quad \text{(for large q)} \quad (3)$$

indicating that the charge q is non-linearly converted into the charge $q_2$. It has been found that the non-linearity depends on the bottom shape of potential wells, manner of division of photoelectric converting areas and manner of gate control.

FIG. 10A illustrate an embodiment of electrodes for realizing the concept shown in FIGS. 9A to 9C. In FIG. 10A there are shown electrodes 20 of the analog shift register; channel stops 21, 22; first and second photoelectric converting areas 23, 24; a first gate electrode 25; a second gate electrode 26; an overflow drain 27, a third electrode 28; shift pulses $\phi 4$, $\phi 5$ for the analog shift register; and control clock pulses $\phi 6$, $\phi 7$ and $\phi 8$ respectively for the first, second and third gates. Also FIGS. 10B and 10C show different embodiments of the potential well form in the cross section of the photoelectric converting areas taken in the X-X' direction.

Figure 11:
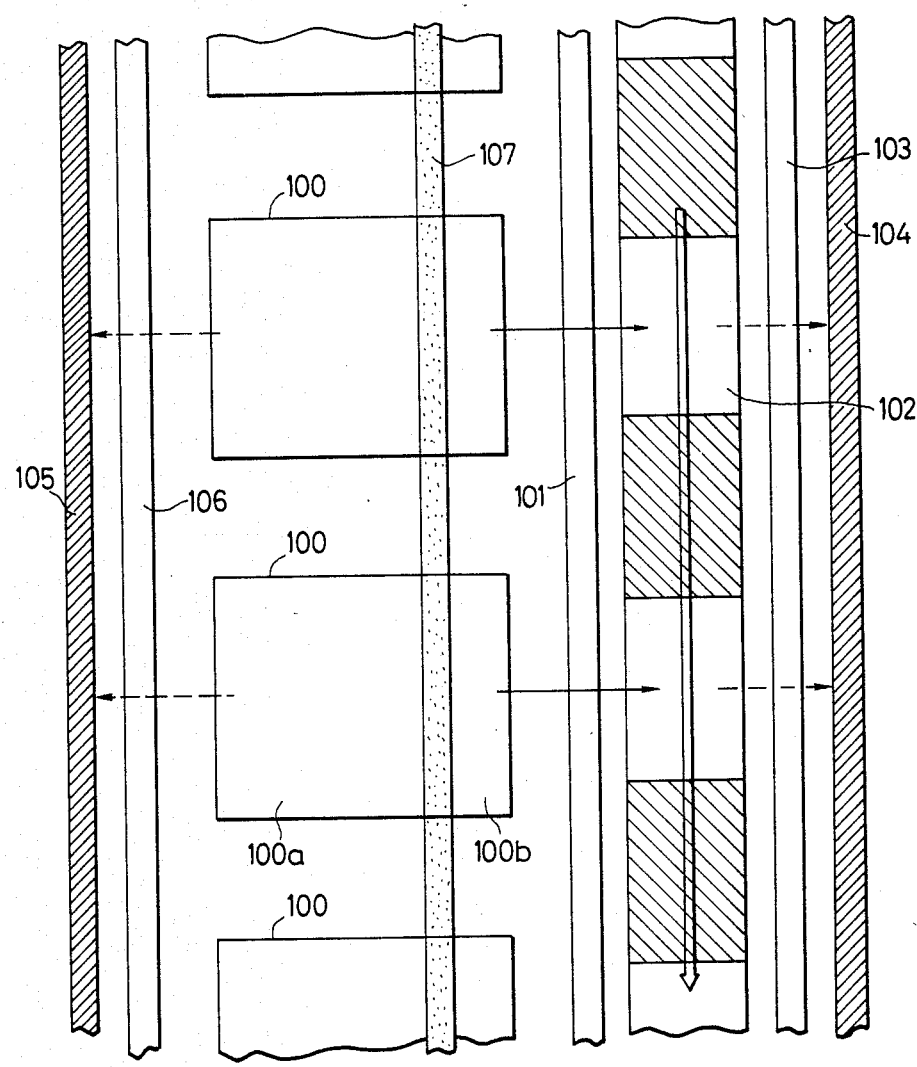
FIG. 11 is a schematic view showing a sixth embodiment of the present invention.

FIG. 11 shows a sixth embodiment of the present invention, wherein shown are photoelectric converting areas 100 respectively divided into first converting areas 100a and second converting areas 100b; a first gate 101; an analog shift register 102; an overflow drain gate 106 functioning as a second gate; a first overflow drain 105; a third gate 107; an overflow drain gate 103 functioning as a fourth gate; and a second overflow drain 104. In the present embodiment the structure of the electrodes is simplified by the presence of the third gate parallel to the first and second gates. Also the charge resetting is facilitated since the first and second overflow drains are provided on both sides of the third gate. More specifically the resetting of the charges in the second photoelectric converting areas is made easier since the unnecessary charges can be discharged to the overflow drain 104 through the analog shift register. Also the excessive charge generated during the exposure or charge accumulation is discharged to the overflow drain 105 through the overflow drain gate 106.

Figure 12A:
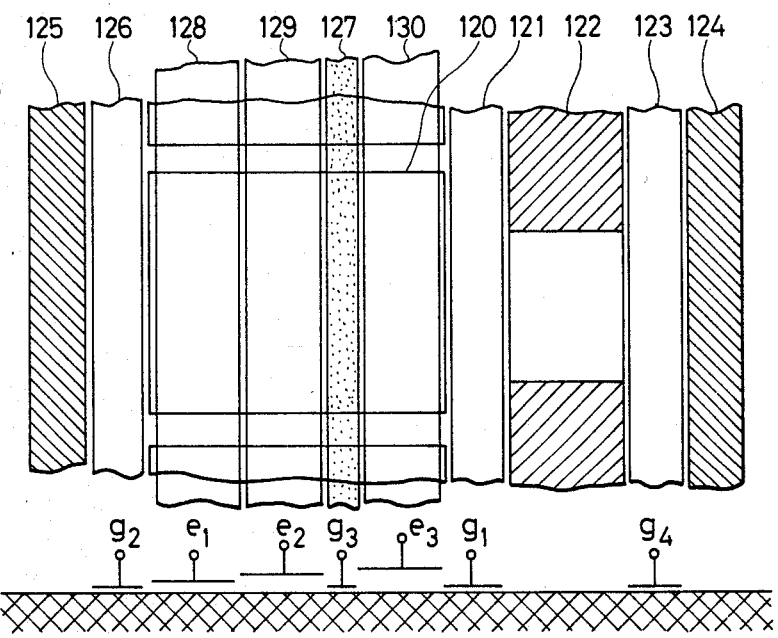
FIG. 12A is a schematic view showing a seventh embodiment of the present invention.
Figure 12B:
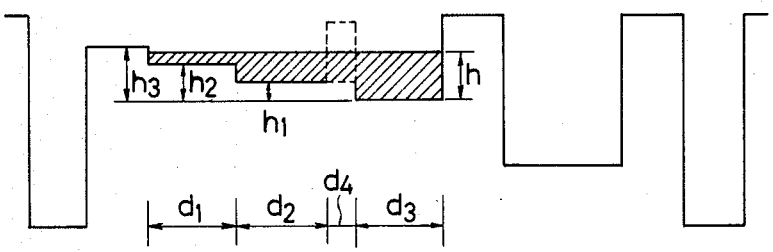
FIG. 12B is a schematic view showing potential therein.
Figure 13:
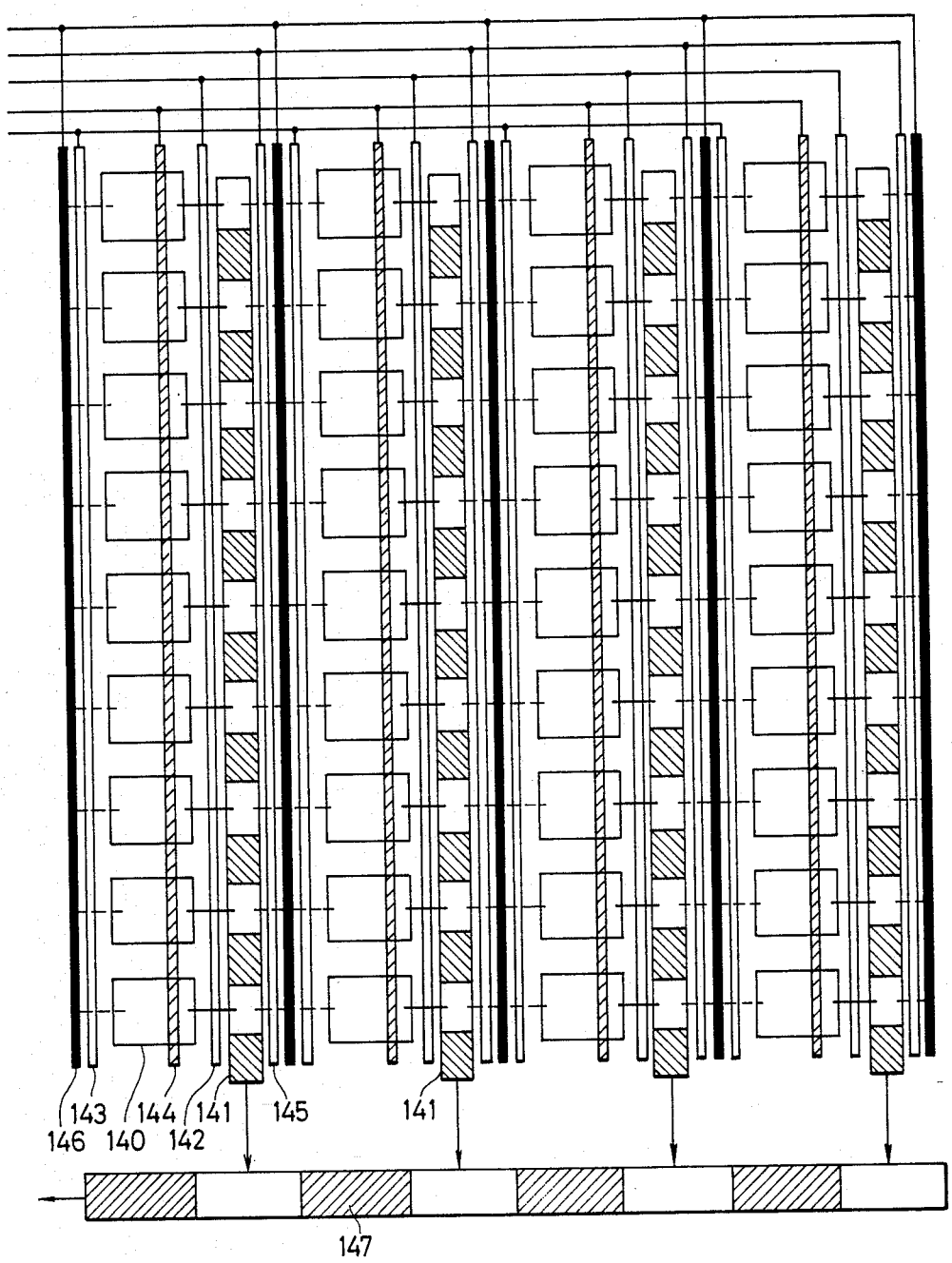
FIG. 13 is a view showing an expansion of the embodiment shown in FIG. 11.

FIGS. 12A and 12B show a seventh embodiment of the present invention representing another electrode structure and potential structure of the apparatus shown in FIG. 11, and FIG. 13 shows a structure expanded to an area sensor, wherein shown are photoelectric converting areas 102; a first gate 121; an analog shift register 122; a second gate 126; a first overflow drain 125; a third gate 127; first and second electrodes 128, 129 covering the first photoelectric converting area; a third electrode 130 corresponding to the second photoelectric converting area; a fourth gate 123; and a second overflow drain 124.

FIG. 12B shows the potential profile of the structure shown in FIG. 12A, wherein g1, g2, g3 and g4 respectively indicate the first, second, third and fourth gate signal terminals, and e1, e2 and e3 respectively represent signal terminals of the first, second and third electrodes. The amount of charge qi accumulated in a given photoelectric converting area i after the exposure is represented by the following equation:

$$q_i = \int_0^\tau I_i dt \quad (4)$$

wherein $I_i$ is the intensity of light and $\tau$ is the period of charge accumulation. If the intensity $I_i$ shows little change in a range $(0, \tau)$, the above-mentioned equation can be rewritten as:

$$q_i \propto I_i \tau \quad (5)$$

On the other hand, when the charge is accumulated to a height h from the bottom of the potential well under the third electrode, the accumulated charge $q_i$ can be represented by the following equations:

$$q_i/k = \begin{cases} d_3 h & \{0 \leq h \leq h_1\} \\ d_3 h + (d_2 + d_4)(h - h_1) & \{h_1 \leq h \leq h_2\} \\ d_3 h + (d_2 + d_4)(h - h_1) + d_1(h - h_2) & \{h_2 \leq h \leq h_3\} \end{cases} \quad (6)$$

wherein k is a coefficient.

The charge $q_{i0}$ transferred to the analog shift register out of the photoelectrically induced charge $q_i$ is equal to the charge $q_{i3}$ accumulated under the third electrode, so that:

$$q_{i0} = q_{i3} = kd_3 h \quad (7)$$

If the width $d_4$ is negligible, then:

$$q_i/k = \quad (8)$$

$$\begin{cases} d_3 h & (0 \leq h \leq h_1) \\ \left(1 + \dfrac{d_2}{d_3}\right) d_3 h - d_2 h_1 & (h_1 \leq h \leq h_2) \\ \left(1 + \dfrac{d_2}{d_3} + \dfrac{d_1}{d_3}\right) d_3 h - (d_2 h_1 + d_1 h_2) & (h_2 \leq h \leq h_3) \end{cases}$$

Consequently $q_{i0}$ is represented by:

$$q_{i0} = \begin{cases} q_i & (0 \leq q_i \leq a_1) \\ \left(\dfrac{d_3}{d_2 + d_3}\right)(q_i + kd_2 h_1) & (a_1 \leq q_i \leq a_2) \\ \left(\dfrac{d_3}{d_1 + d_2 + d_3}\right)(q_i + kd_2 h_1 + kd_1 h_2) & (a_2 \leq q_i \leq a_3) \end{cases} \quad (9)$$

wherein, $$\begin{cases} a_1 = kd_3 h_1 \\ a_2 = k\{d_3 h_2 + d_2(h_2 - h_1)\} \\ a_3 = k\{d_3 h_3 + d_2(h_3 - h_1) + d_1(h_3 - h_2)\} \end{cases}$$

Figure 12C:
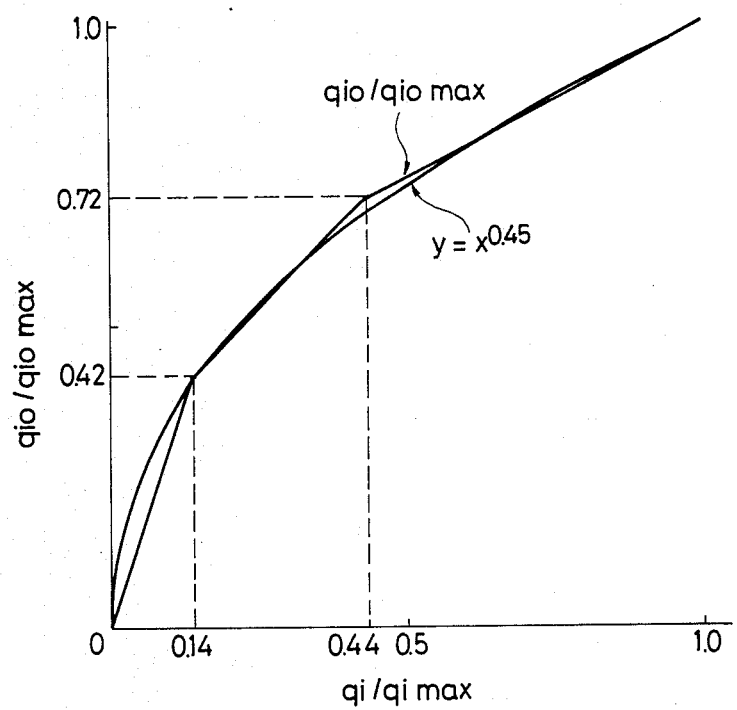
FIG. 12C is a chart showing the characteristic obtained by said seventh embodiment.

Thus the characteristic $(q_i - q_{i0})$ is represented by three line portions and can therefore exhibit a non-linear behavior. As an example, for a condition:

$$\left. \begin{array}{l} d_1 : d_2 : d_3 = 3:2:1 \\ h_1 : h_2 : h_3 = 0.42 : 0.72 : 1 \end{array} \right\} \quad (10)$$

there is obtained a relation:

$$a_1 : a_2 : a_3 = 0.14 : 0.44 : 1 \quad (11)$$

corresponding to a curve $y = x^{0.45}$ approximated by three linear portions as shown in FIG. 12C, in which $q_{imax}$ and $q_{i0max}$ are equal to the values of $q_i$ and $q_{i0}$ when $h = h_3$, and the illustrated curved is normalized with said values. Consequently the ratio of $h_1$, $h_2$ and $h_3$ determines the connecting points of said linear portions, while the ratio of $d_1$, $d_2$ and $d_3$ determines the gains of said linear portions. The maximum total charge to be accumulated in the photoelectric converting area 120 is equal to $q_{imax}$, since, in the condition $h > h_3$, the charge is no longer accumulated but is discharged to the overflow drain 125. In this manner the light energy incident to a pixel is proportional to the charge $q_i$, thus providing the photoelectric converting characteristic as shown in FIG. 12C. The profile of the potential well of the photoelectric converting area shown in FIG. 12B can be controlled either by the voltages of electrodes or by other methods such as ion planting, and the accuracy of approximation can be improved by increasing the number of steps in the potential profile.

FIG. 13 shows the embodiment of FIG. 11 expanded into an area sensor provided with photoelectric converting areas 140; first analog shift registers 141; first, second, third and fourth electrodes 142, 143, 144 and 145; overflow drains 146; and a second analog shift register 147. The procedure of charge transfer to the first analog shift register can be same as that already explained in relation to the embodiment shown in FIG. 11. The procedure of charge transfer from the first analog shift registers 141 to the second analog shift register 147 for signal readout is already well known and is therefore omitted from the explanation.

Figure 14:
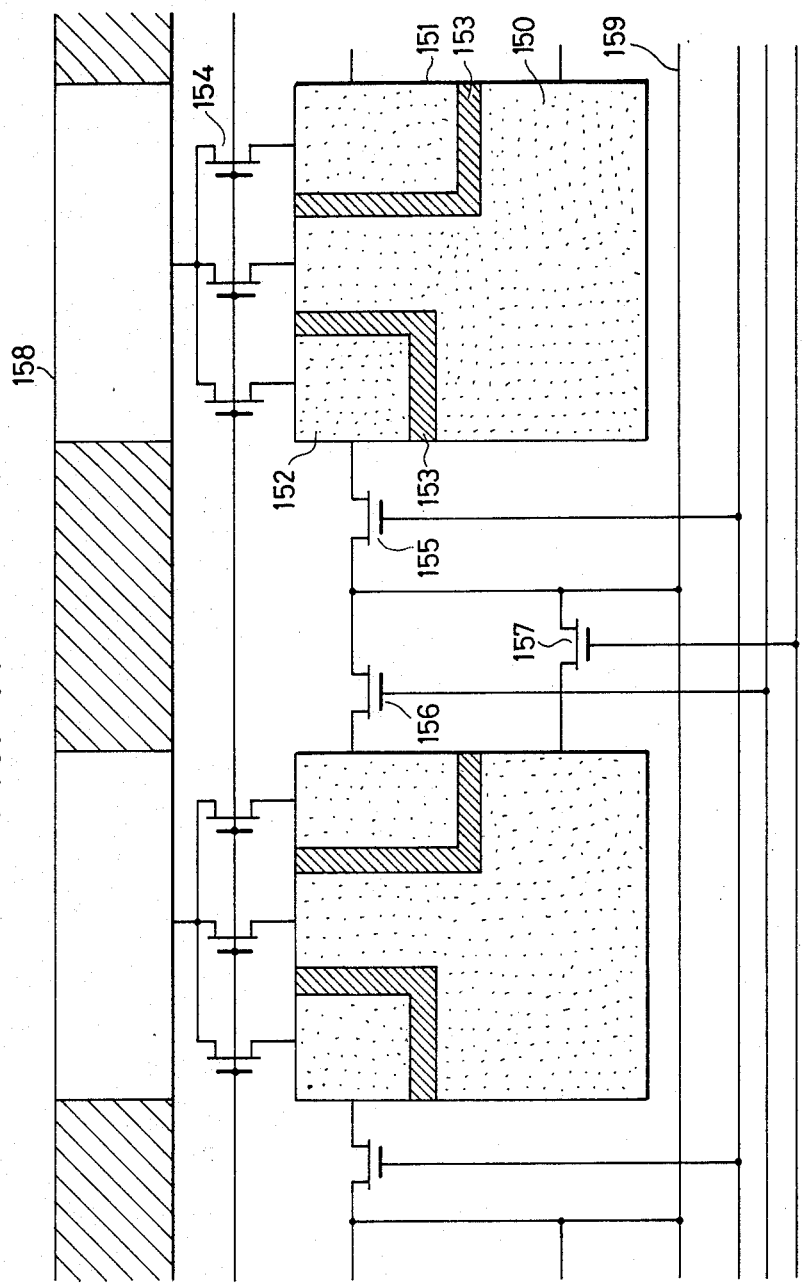
FIG. 14 is a schematic view showing an eighth embodiment of the present invention.
Figure 15A:
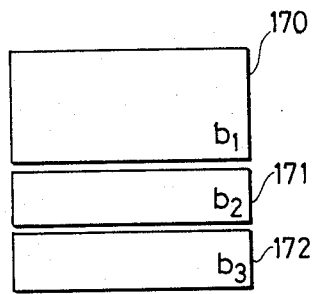
FIGS. 15A to 15C are views showing an example of the potential structure in the embodiment shown in FIG. 14.
Figure 15C:
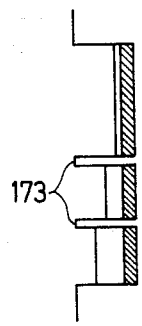
Figure 15B:
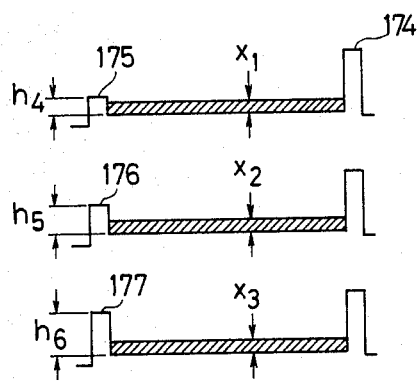

FIG. 14 shows an eighth embodiment of the present invention for attaining a non-linear $I_i-q_{i0}$ characteristic, wherein provided are first photoelectric converting areas 150; second photoelectric converting areas 151; third photoelectric converting areas 152; channel stops 153; first gates 154; an analog shift register 158 and an overflow drain 159. In the present embodiment the first gate is utilized as a transfer gate for transferring the charges accumulated in the first, second and third converting areas to the anlog shift register 158 and is opened for example only at said charge transfer. Overflow drain gates 155–157 functioning as the second gate are opened for example only at the charge resetting, and have different potential heights during the charge accumulation as shown in FIG. 15B. The first, second and third photoelectric converting areas may be realized in various forms and dimensions. FIGS. 15A to 15C show an embodiment of relatively simple division into three areas, but the number of divided areas is not limited to such example. In this embodiment there are provided a first photoelectric converting area 70; a second photoelectric converting area 171; a third photoelectric converting area 172; a first gate 174; overflow drain gates 175–177 corresponding to the aforementioned gates 155–157; and a channel stop 173. Now, let us assume that the first, second and third photoelectric converting regions respectively have areas $b_1$, $b_2$ and $b_3$, and that the overflow drain gates 175–177 respectively have heights $h_4$, $h_5$ and $h_6$. Since the amount of charge q generated by photoelectric conversion during the charge accumulating period $\tau$ is proportional to the amount of light I incident to the corresponding picture element, there stands a relation:

$$q = kI\tau \tag{12}$$

wherein k is a coefficient. In this state the charges generated in the first, second and third converting areas are represented by:

$$\begin{cases} q_1 = \dfrac{b_1}{b_1 + b_2 + b_3} kI\tau \\ q_2 = \dfrac{b_2}{b_1 + b_2 + b_3} kI\tau \\ q_3 = \dfrac{b_3}{b_1 + b_2 + b_3} kI\tau \end{cases} \tag{13}$$

On the other hand, when the charges are accumulated in the first, second and third converting areas respectively to heights $x_1$, $x_2$ and $x_3$, the amounts of charges $s_1$, $s_2$ and $s_3$ accumulated in said converting areas are represented by:

$$\begin{cases} s_1 = k'b_1x_1, & 0 \leq x_1 \leq h_4 \\ s_2 = k'b_2x_2, & 0 \leq x_2 \leq h_5 \\ s_3 = k'b_3x_3, & 0 \leq x_3 \leq h_6 \end{cases} \tag{14}$$

Since the maximum values of $x_1$, $x_2$ and $x_3$ are respectively equal to $h_4$, $h_5$ and $h_6$, the maximum charges $q_{1m}$, $q_{2m}$ and $q_{3m}$ that can be accumulated in said converting areas are represented by:

$$\begin{cases} q_1 = k'b_1h_4 \\ q_2 = k'b_2h_5 \\ q_3 = k'b_3h_6 \end{cases} \tag{15}$$

and any charge excessively generated is discharge to the overflow drain 159.

Then assuming:

$$h = \dfrac{1}{b_1 + b_2 + b_3} \dfrac{k}{k'} \tau I \tag{16}$$

the charges $s_1$, $s_2$ and $s_3$ can be represented by:

$$s_1 = \begin{cases} q_1 & (0 \leq h \leq h_4) \\ q_{1m} & (h_4 \leq h) \end{cases} \tag{17}$$

$$s_2 = \begin{cases} q_{2m} & (0 \leq h \leq h_5) \\ q_{2m} & (h_5 \leq h) \end{cases}$$

$$s_3 = \begin{cases} q_3 & (0 \leq h \leq h_6) \\ q_{3m} & (h_6 \leq h) \end{cases}$$

Thus, when the sum of the charges $s_1$, $s_2$ and $s_3$ is transferred to the analog shift register, the transferred charge $q_t$ is represented by:

$$q = s_1 + s_2 + s_3 \tag{18}$$

In summary there can be obtained the following equations:

$$q_t = \begin{cases} kI\tau & (0 \leq h \leq h_4) \\ \dfrac{b_2 + b_3}{b_1 + b_2 + b_3} kI\tau + k'b_1h_4 & (h_4 \leq h \leq h_5) \\ \dfrac{b_3}{b_1 + b_2 + b_3} kI\tau + k'b_1h_4 + k'b_2h_5 & (h_5 \leq h \leq h_6) \end{cases} \tag{19}$$

wherein $h_4 < h_5 < h_6$. A relationship as shown in FIG. 12C can therefore be obtained for a condition:

$$\begin{cases} b_1:b_2:b_3 = 4:1:1 \\ h_4:h_5:h_6 = 0.42:0.30:0.28 \end{cases} \tag{20}$$

Figure 16A:
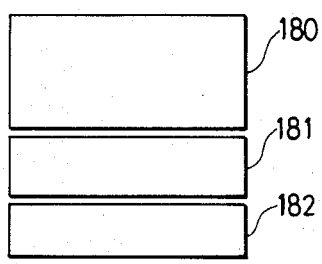
FIGS. 16A to 16C are schematic views of potential structure in a ninth embodiment of the present invention.
Figure 16C:
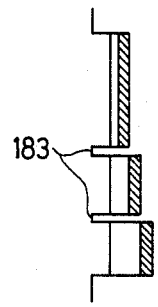
Figure 16B:
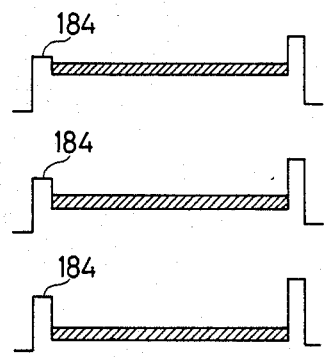

FIGS. 16A to 16C show a ninth embodiment of the present invention modified from the embodiment shown in FIGS. 15A to 15C. In the present embodiment there are provided first, second and third photoelectric converting areas 180, 181, 182; channel stops 183; and an overflow drain gate 184. The first, second and third potential wells have different depths to show different relative depths to the overflow drain gates, thus achieving substantially the same function as that of the embodiment shown in FIGS. 15A to 15C.

Figure 17A:
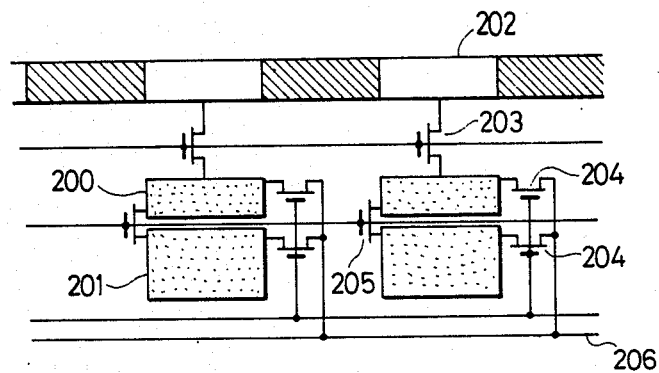
FIGS. 17A to 17C are schematic views showing a tenth embodiment of the present invention.
Figure 17C:
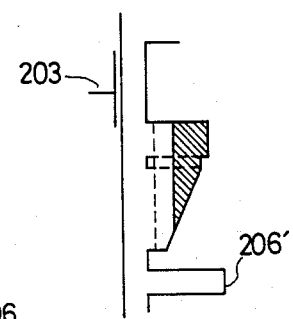
Figure 17B:
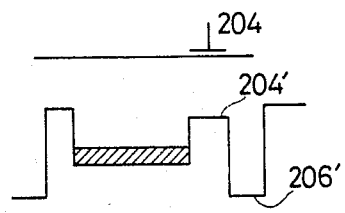
Figure 18:
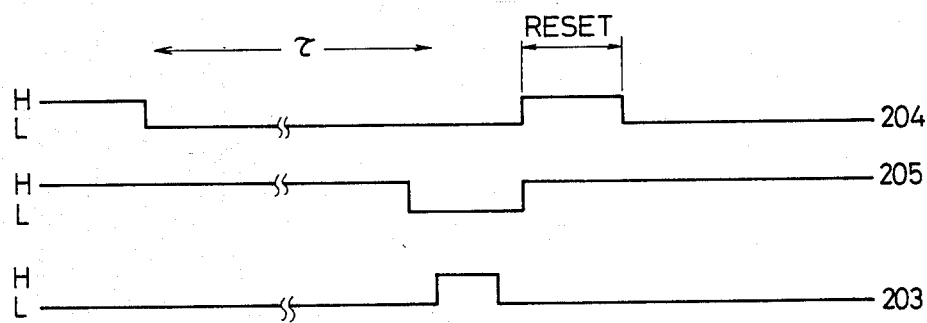
FIG. 18 is a timing chart showing the function of the tenth embodiment shown in FIG. 17A.

FIGS. 17A to 17C show a tenth embodiment of the present invention, wherein provided are first and second photoelectric converting areas 200, 201; an analog shift register 202; a first gate 203 as a shift gate; a second gate 204 as a resetting gate or an overflow drain gate; a third gate 205 as a dividing gate; and an overflow drain 206. 204' and 206' respectively show the potentials of the overflow drain gate 204 and the overflow drain 206. FIG. 18 is a timing chart showing the function of the first, second and third gates, wherein $\tau$ is the charge accumulating period, and each gate is either opened or closed respectively at H or L. This embodiment is close to that shown in FIG. 11 but is different from the latter in that the overflow drain gate 204 is provided at the illustrated position, whereby the charge resetting can be completed merely by opening the overflow drain gate 204. More specifically, after the reset gate is closed, the dividing gate 205 is closed to transfer the charge of the second photoelectric converting area to the register 202 through the shift gate 203, and the resetting gate 204 is again opened thereafter.

Figure 19A:
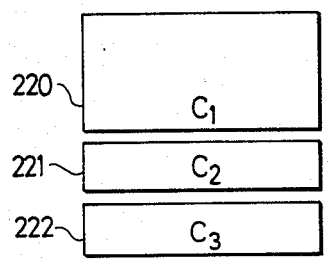
FIGS. 19A to 19C are schematic views showing the structure of potential wells in an eleventh embodiment of the present invention.
Figure 19C:
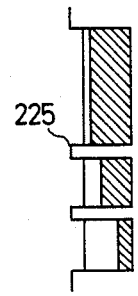
Figure 19B:
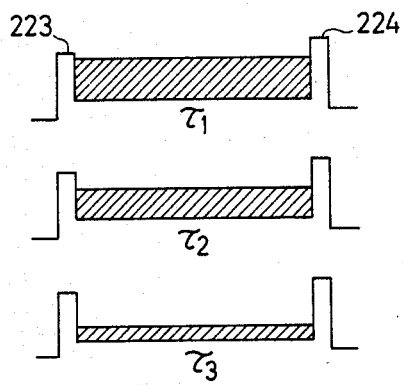

FIGS. 19A to 19C show an eleventh embodiment of the present invention, wherein provided are first, second and third photoelectric converting areas 220-222; an overflow drain gate 223; a shift gate 224; channel stops 225. The first, second and third photoelectric converting areas are assumed to have respective charge accumulating periods $\tau_1$, $\tau_2$ and $\tau_3$. If an incident energy I produces a charge v per unit area and unit time, there stands:

$$v = kI \tag{21}$$

so that the charges $v_1$, $v_2$ and $v_3$ generated in the first, second and third converting areas are represented by the following equations:

$$\begin{cases} v_1 = c_1 \tau_1 v \\ v_2 = c_2 \tau_2 v \\ v_3 = c_3 \tau_3 v \end{cases} \tag{22}$$

Thus the maximum charges $v_{1m}$, $v_{2m}$ and $v_{3m}$ formed in the first, second and third converting areas are given by:

$$\begin{cases} v_{1m} = k c_1 \\ v_{2m} = k c_2 \\ v_{3m} = k c_3 \end{cases} \tag{23}$$

For a condition:

$$\tau_1 \geq \tau_2 \geq \tau_3 \tag{24}$$

the amount of charge V accumulated in the first, second and third photoelectric converting areas during the total charge accumulating period $\tau = \tau_1$ is represented by:

$$V = \begin{cases} (c_1\tau_1 + c_2\tau_2 + c_3\tau_3) v & \left(0 \leq v \leq \dfrac{k}{\tau_1}\right) \\ (c_2\tau_2 + c_3\tau_3)v + v_{1m} & \left(\dfrac{k}{\tau_1} \leq v \leq \dfrac{k}{\tau_2}\right) \\ c_3\tau_3 + v_{1m} + v_{2m} & \left(\dfrac{k}{\tau_2} \leq v \leq \dfrac{k}{\tau_3}\right) \end{cases} \tag{25}$$

Thus, for a condition:

$$\tau_1 : \tau_2 : \tau_3 = \tau : \alpha\tau : \beta\tau \tag{26}$$

The above-mentioned equations can be rewritten as:

$$V = \begin{cases} (c_1 + c_2\alpha + c_3\beta) k\tau I & \left(0 \leq \tau I \leq \dfrac{k}{k}\right) \\ (c_2\alpha + c_3\beta) k\tau I + kc_1 & \left(\dfrac{k}{k} \leq \tau I \leq \dfrac{k}{k\alpha}\right) \\ (c_3\beta)k\tau I + k(c_1 + c_2) & \left(\dfrac{k}{k\alpha} \leq \tau I \leq \dfrac{k}{k\beta}\right) \end{cases} \tag{26}$$

In this manner a characteristic curve as shown in FIG. 12C can be obtained in the following conditions:

$$c_1 : c_2 : c_3 = 0.42 : 0.30 : 0.28$$

$$1 : \alpha : \beta = 1 : 0.93 : 0.5$$

As explained in the foregoing, the present invention enables easy adjustment of the $\gamma$-characteristic in the course of charge transfer from the photoelectric converting areas of a charge-coupled device to the analog shift register by dividing a photoelectric converting area corresponding to a picture element into plural areas with mutually different structures or with mutually different charge accumulating states as explained in the foregoing embodiments. In this manner the present invention is adapted for use in a system requiring $\gamma$-correction, such as a television system, and provides various advantages of enabling compactization of the system and widening the dynamic range of the system.

Although the signal processing apparatus shown in FIGS. 9 to 19 is provided with image pickup function, it is naturally possible also to mask the photoelectric converting areas and to introduce the charge information from the exterior instead of the optical information entry.

What is claimed is:
1. A signal processing apparatus comprising:
 (a) an analog shift register having plural addresses, for shifting input analog data without changing the input analog data to be shifted;
 (b) plural discriminating means for comparing the levels of analog information in different addresses of said register respectively with predetermined reference levels; and
 (c) a plurality of digital registers each arranged to correspond to a respective one of said plural discriminating means and each having first and second input terminals which respectively receive digital data associated with said reference levels and data contained in an adjacent one of said digital registers, and each of said digital registers, in response to an output from the corresponding one of said discriminating means, storing the data at either one of said first or second input terminals.

2. A signal processing apparatus according to claim 1, wherein the reference levels of said discriminating means are linearly changed in the order of corresponding addresses of said analog shift register.

3. A signal processing apparatus according to claim 2, wherein the reference levels of said discriminating means are non-linearly changed in the order of corresponding addresses of said analog shift register.

4. A signal processing apparatus according to claim 1, wherein said predetermined data is a determined function of the reference level of the discriminating means.

5. A processor comprising:
 (a) an input signal shift register having a plurality of addresses, for shifting input data without changing an input signal containing the input data;
 (b) means for generating a plurality of reference signals;
 (c) a plurality of comparators for comparing said input data shifted with the reference signals, each comparator comparing one of the reference signals with the input data which is shifted to one address in said register;
 (d) means for generating a plurality of different data;
 (e) a second shift register having a plurality of stages, each stage being connected to a respective one of said plurality of comparators and, in synchronization with said input shift register, transferring one of (1) said plurality of different data or (2) data shifted from a preceding stage; and
 (f) control means for controlling each stage of said second shift register, by controlling the data selected by one of said comparators and in response to said comparator's output transferred from said second shift register.

6. The processor according to claim 5, wherein the addresses in said input shift register are equal in number to the reference signals.

7. The processor according to claim 5, wherein said comparators are equal in number to the reference signals.

8. The processor according to claim 5, wherein said input signal is an analog signal.

9. The processor according to claim 5, wherein said converted data is a digital signal.

* * * * *

UNITED STATES PATENT AND TRADEMARK OFFICE
CERTIFICATE OF CORRECTION

PATENT NO. : 4,800,591
DATED : January 24, 1989
INVENTOR(S) : YUICHI SATO

Page 1 of 4

It is certified that error appears in the above-identified patent and that said Letters Patent is hereby corrected as shown below:

COLUMN 1

Line 42, "constant." should read --constant,--.
Line 54, "sample" should read --simple--.
Line 56, "circuit is needed for each of the" should be deleted.
Line 57, "luminance signal and color" should be deleted.
Line 60, "semi-conductor" should read --semiconductor--.

COLUMN 2

Line 21, "semi-conductor" should read --semiconductor--.

COLUMN 3

Line 65, "may" should read --may be--.

COLUMN 4

Line 31, "AND gates $31_1$-$33_n$;" should read --AND gates $33_1$-$33_n$;--.

COLUMN 6

Line 27, "embodiments" should read --embodiment--.

COLUMN 7

Line 11, "with inverted inputs, gates $OR_1$-$OR_n$" should read --gates $OR_1$-$OR_n$ with inverted inputs,--.
Line 12, "inoput" should read --input--.

UNITED STATES PATENT AND TRADEMARK OFFICE
CERTIFICATE OF CORRECTION

PATENT NO. : 4,800,591
DATED : January 24, 1989
INVENTOR(S) : YUICHI SATO

Page 2 of 4

It is certified that error appears in the above-identified patent and that said Letters Patent is hereby corrected as shown below:

COLUMN 8

Line 27, "a" should read --the--.
Line 41, "illustrate" should read --illustrates--.
Line 35, "(3)" should read --(4)--.
Line 46, "overflow drain 27," should read --overflow drain 27;--.

COLUMN 9

Line 32-33, $$q_i = \int_0^T -I_i dt \quad (4)$$

should read $$q_i = \int_0^T I_i dt \quad (5)$$

Line 41, "$q_i a I_i \gamma$ (5)" should read --$q_i \circ I_i x$ (6)--.
Lines 49-53, "
$\{0 \leq h \leq h_1\}$
$\{h_1 \leq h \leq h_2\}$  (6)" should read
$\{h_2 \leq h \leq h_3\}$ --
$\{0 \leq h \leq h_1\}$
$\{h_1 < h \leq h_2\}$  (7)--.
$\{h_2 < h \leq h_3\}$ Line 63, "(7)" should read --(8)--.
Line 67, "(8)" should read --(9)--.

COLUMN 10

Line 13, "(9)" should read --(10)--.
Line 34, "(10)" should read --(11)--.
Line 41, "(11)" should read --(12)--.
Line 45, "curved" should read --curve--.

UNITED STATES PATENT AND TRADEMARK OFFICE
CERTIFICATE OF CORRECTION

PATENT NO. : 4,800,591
DATED : January 24, 1989
INVENTOR(S) : YUICHI SATO

It is certified that error appears in the above-identified patent and that said Letters Patent is hereby corrected as shown below:

COLUMN 11

Line 1, "same" should read --the same--.
Line 16, "anlog" should read --analog--.
Line 26, "first photoelectric converting area 70;" should read --first photoelectric converting area 170;--.
Line 41, "(12)" should read --(13)--.
Line 47, "(13)" should read --(14)--.
Line 62, "(14)" should read --(15)--.

COLUMN 12

Line 5, "(15)" should read --(16)--.
Line 10, "discharge" should read --discharged--.

Line 15, "$h = \frac{1}{b_1+b_2+b_3} \frac{k}{k} \tau I \quad (16)$" should read --$h \stackrel{\Delta}{=} \frac{1}{b_1+b_2+b_3} \frac{k}{k} \tau I \quad (17)$--.

Line 20, "(17)" should read --(18)--.
Line 24-25, "$s_2 = \begin{cases} q_2 m & (0 \leq h \leq h_5) \\ q_2 m & (h_5 \leq h) \end{cases}$" should read --$s_2 = \begin{cases} q_2 & (0 \leq h \leq h_5) \\ q2m & (h_5 \leq h) \end{cases}$--.

Line 37, "$q = s_1+s_2+s_3 \quad (18)$" should read --$qt = s_1+s_2+s_3 \quad (19)$--.
Line 43, "(19)" should be --(20)--.
Line 54, "(20)" should be --(21)--.

UNITED STATES PATENT AND TRADEMARK OFFICE
CERTIFICATE OF CORRECTION

PATENT NO. : 4,800,591
DATED : January 24, 1989
INVENTOR(S) : YUICHI SATO

Page 4 of 4

It is certified that error appears in the above-identified patent and that said Letters Patent is hereby corrected as shown below:

COLUMN 13

Line 38, "(21)" should read --(22)--.
Line 44, "(22)" should read --(23)--.
Line 54, "(23)" should read --(24)--.
Line 62, "(24)" should read --(25)--.

COLUMN 14

Line 1, "(15)" should read --(26)--.
Line 15, "(26)" should read --(27)--.
Line 18, "(26)" should read --(28)--.

Line 32, "$c_1:C_2:c_3=0.42:0.30:0.28$" should read
--$c_1:c_2:c_3=0.42:0.30:0.28$--.

Signed and Sealed this

Twelfth Day of November, 1991

Attest:

HARRY F. MANBECK, JR.

*Attesting Officer*   *Commissioner of Patents and Trademarks*